United States Patent
Kitagawa et al.

(10) Patent No.: US 8,067,809 B2
(45) Date of Patent: Nov. 29, 2011

(54) SEMICONDUCTOR STORAGE DEVICE INCLUDING A GATE INSULATING FILM WITH A FAVORABLE NITROGEN CONCENTRATION PROFILE AND METHOD FOR MANUFACTURING THE SAME

(75) Inventors: Junichi Kitagawa, Amagasaki (JP); Shigenori Ozaki, Amagasaki (JP); Akinobu Teramoto, Sendai (JP); Tadahiro Ohmi, Sendai (JP)

(73) Assignees: Tokyo Electron Limited, Tokyo (JP); Tohoku University, Sendai-shi (JP)

( * ) Notice: Subject to any disclaimer, the term of this patent is extended or adjusted under 35 U.S.C. 154(b) by 0 days.

(21) Appl. No.: 11/576,499

(22) PCT Filed: Sep. 30, 2005

(86) PCT No.: PCT/JP2005/018179
§ 371 (c)(1),
(2), (4) Date: Jan. 25, 2008

(87) PCT Pub. No.: WO2006/038566
PCT Pub. Date: Apr. 13, 2006

(65) Prior Publication Data
US 2009/0072327 A1 Mar. 19, 2009

(30) Foreign Application Priority Data
Oct. 1, 2004 (JP) ................................. 2004-290768

(51) Int. Cl.
*H01L 21/02* (2006.01)

(52) U.S. Cl. ......... 257/411; 257/E29.255; 257/E21.267; 438/775; 438/266; 438/264

(58) Field of Classification Search .................. 438/776, 438/261, 286, 694, 200; 257/410
See application file for complete search history.

(56) References Cited

U.S. PATENT DOCUMENTS

| 5,464,792 A | 11/1995 | Tseng et al. | |
| 5,620,910 A | 4/1997 | Teramoto | |
| 5,661,056 A * | 8/1997 | Takeuchi | ...... 438/261 |
| 6,265,327 B1 * | 7/2001 | Kobayashi et al. | ........... 438/776 |

(Continued)

FOREIGN PATENT DOCUMENTS

| JP | 6 268234 | 9/1994 |
| JP | 2003 60198 | 2/2003 |
| JP | 2004 214620 | 7/2004 |

(Continued)

OTHER PUBLICATIONS

H.G. Pomp et al., "lightly N2O nitrided dielectrics . . . ", Tech. Dig. IEDM, 1993, p. 463.*

(Continued)

*Primary Examiner* — Thanh V Pham
*Assistant Examiner* — Mark A Laurenzi
(74) *Attorney, Agent, or Firm* — Oblon, Spivak, McClelland, Maier & Neustadt, L.L.P.

(57) ABSTRACT

A semiconductor storage device with excellent electrical characteristics (write/erase characteristics) by favorable nitrogen concentration profile of a gate insulating film, and a method for manufacturing the semiconductor device. The semiconductor device fabricating method operates by transferring charges through a gate insulating film formed between a semiconductor substrate and a gate electrode, including introducing an oxynitriding species previously diluted by plasma excitation gas into a plasma processing apparatus, generating an oxynitriding species by a plasma, and forming an oxynitride film on the semiconductor substrate as the gate insulating film. The oxynitriding species contains NO gas at a ratio of 0.00001 to 0.01% to the total volume of gas introduced into the plasma processing apparatus.

6 Claims, 9 Drawing Sheets

(A)

Gate Injection Stress (B)

Substrate Injection Stress

U.S. PATENT DOCUMENTS

| | | | |
|---|---|---|---|
| 6,716,705 B1 * | 4/2004 | Mehta et al. | 438/266 |
| 6,797,650 B1 * | 9/2004 | Wang et al. | 438/786 |
| 2003/0060058 A1 | 3/2003 | Roy et al. | |
| 2003/0170945 A1 * | 9/2003 | Igeta et al. | 438/200 |
| 2004/0164344 A1 | 8/2004 | Weimer | |
| 2004/0232516 A1 * | 11/2004 | Yoneda | 257/510 |
| 2005/0153570 A1 * | 7/2005 | Matsuyama et al. | 438/777 |

FOREIGN PATENT DOCUMENTS

| | | |
|---|---|---|
| WO | WO 03/030243 A1 | 4/2003 |
| WO | 2004 070816 | 8/2004 |

OTHER PUBLICATIONS

S. Wolf, "silicon processing for the VLSI Era" vol. 4, p. 120.*

Jonghan Kim, et al., "Scaling Down of Tunnel Oxynitride in Nand Flash Memory: Oxynitride Selection and Reliabilities", Reliability Physics Symposium, $35^{TH}$ Annual Proceedings, IEEE International, pp. 12-16, 1997.

David C. T., et al., "Enhanced Reliability for Gate Dielectric of Low-Temperature Polysilicon Thin-Film Transistors by No-Plasma Nitridation", Proceedings, 2002 IEEE Hong Kong Electron Devices Meeting, pp. 35-38, 2002.

S. Maikap, et al., "NO/O$_2$/NO plasma-grown oxynitride films on strained-Si$_{1-x}$Ge$_x$", Electronics Letters, Jul. 8, 1999, vol. 35, No. 14, pp. 1202-1203.

David C. T. Or, et al., "Enhanced reliability for low-temperature gate dielectric of MOS devices by N$_2$O or NO Plasma nitridation", Microelectronics Reliability, 43, 2003, pp. 163-166.

Office Action issued Sep. 29, 2010 in EP Application No. 05 787 588.2.

* cited by examiner

[FIG. 1]
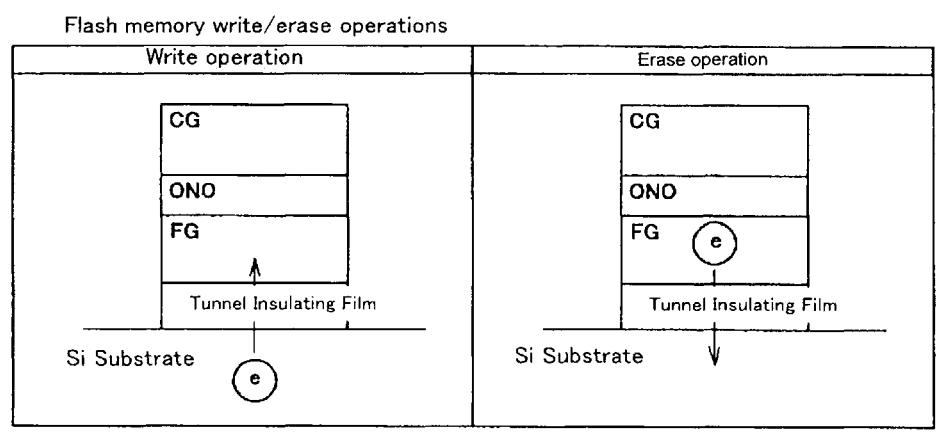

[FIG. 2]
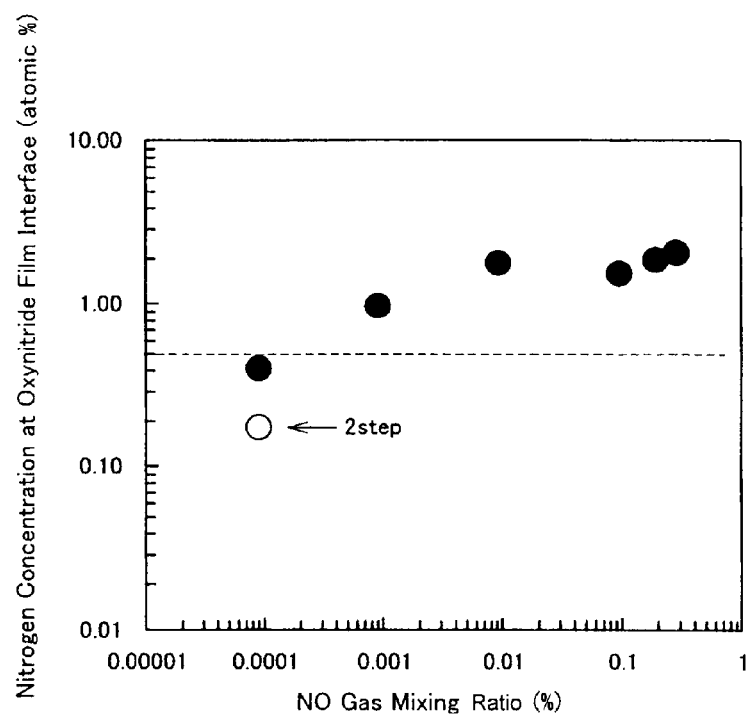

[FIG. 3]
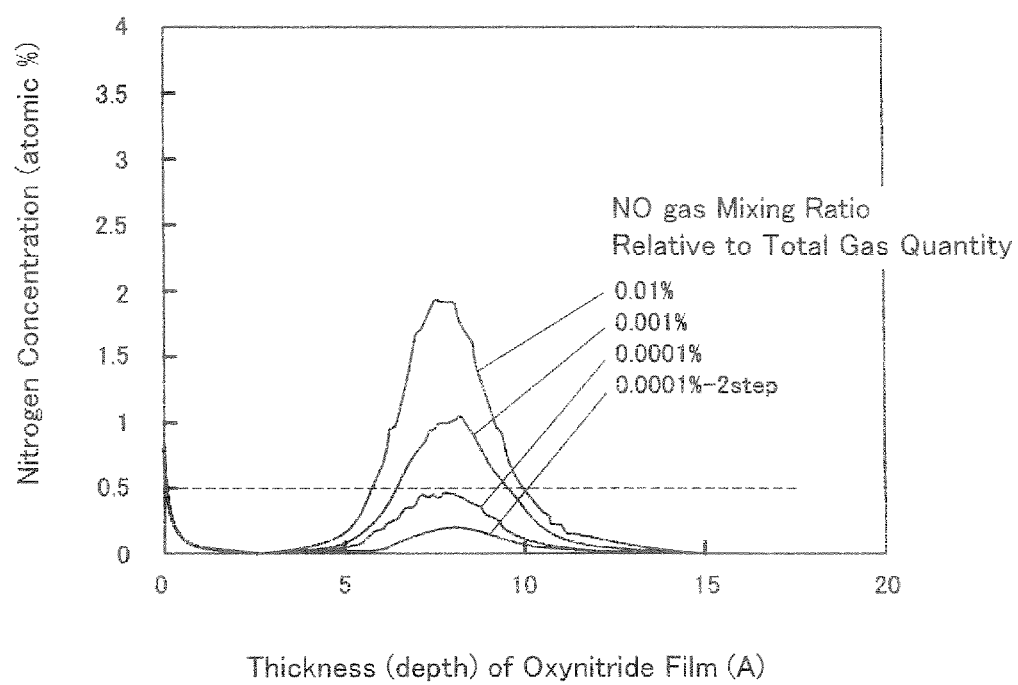

[FIG. 4]
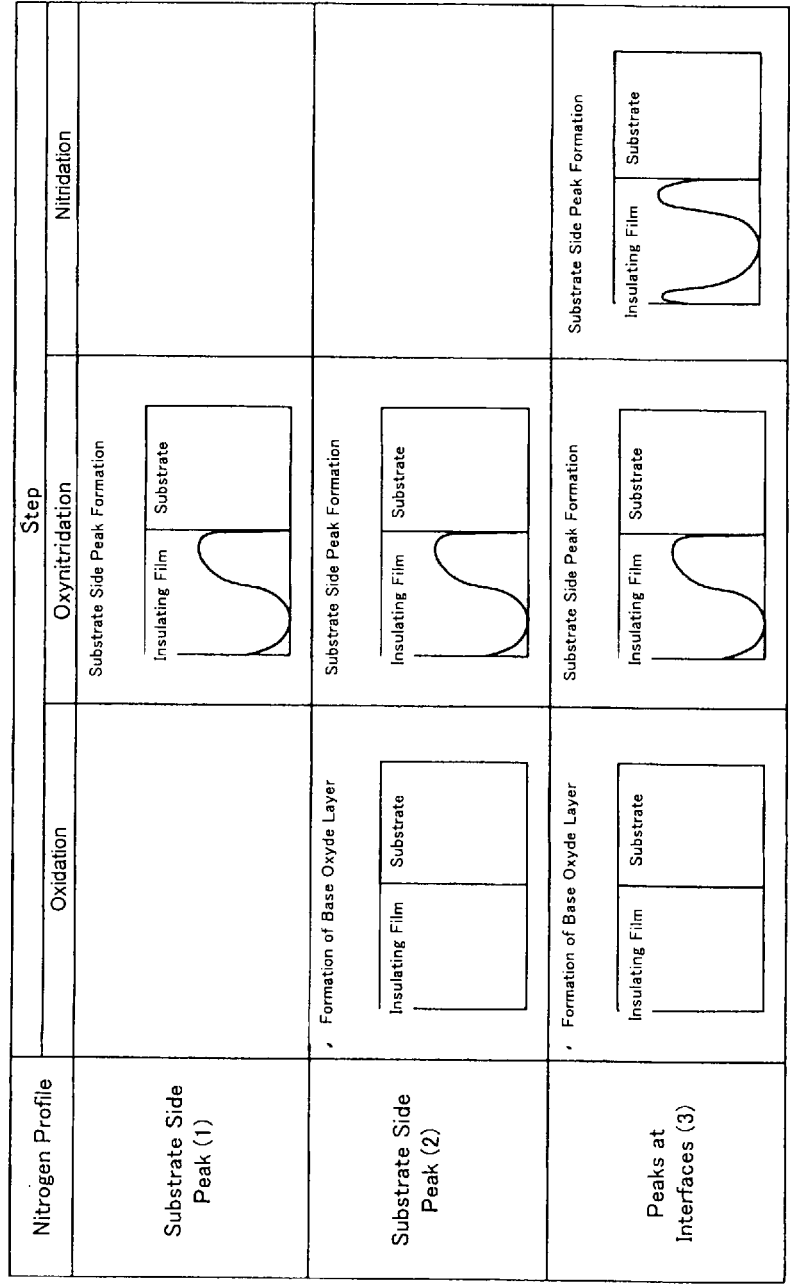

【FIG. 5】
(A)
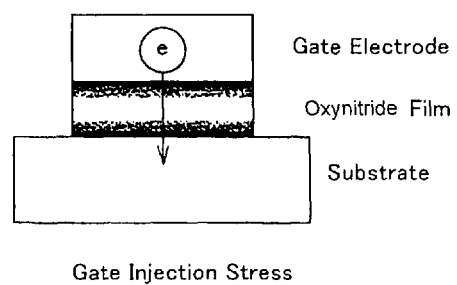
Gate Injection Stress
(B)
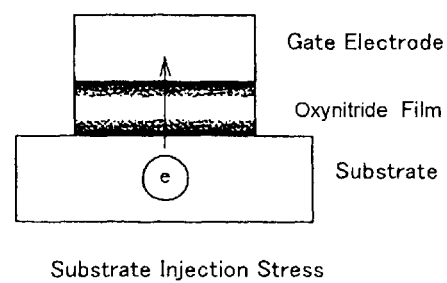
Substrate Injection Stress 【FIG. 6】
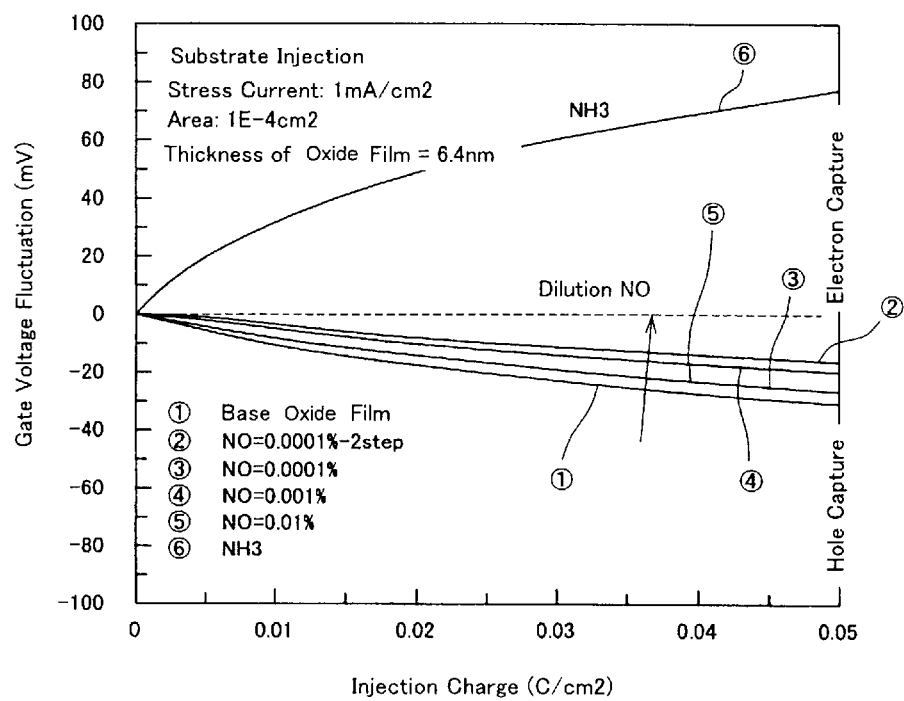

[FIG. 7]
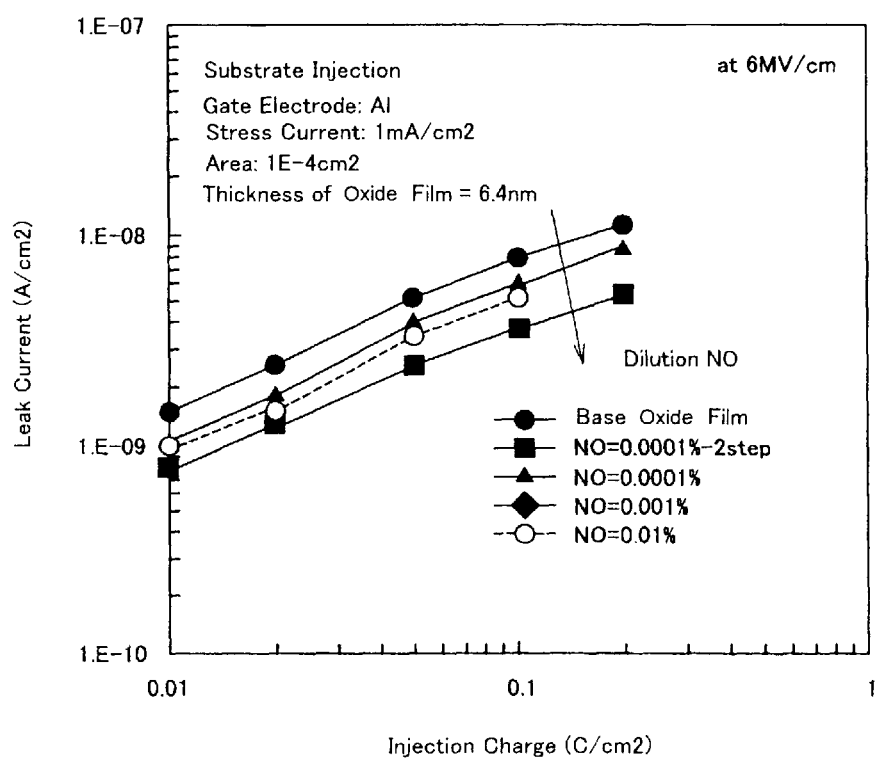

【FIG. 8】
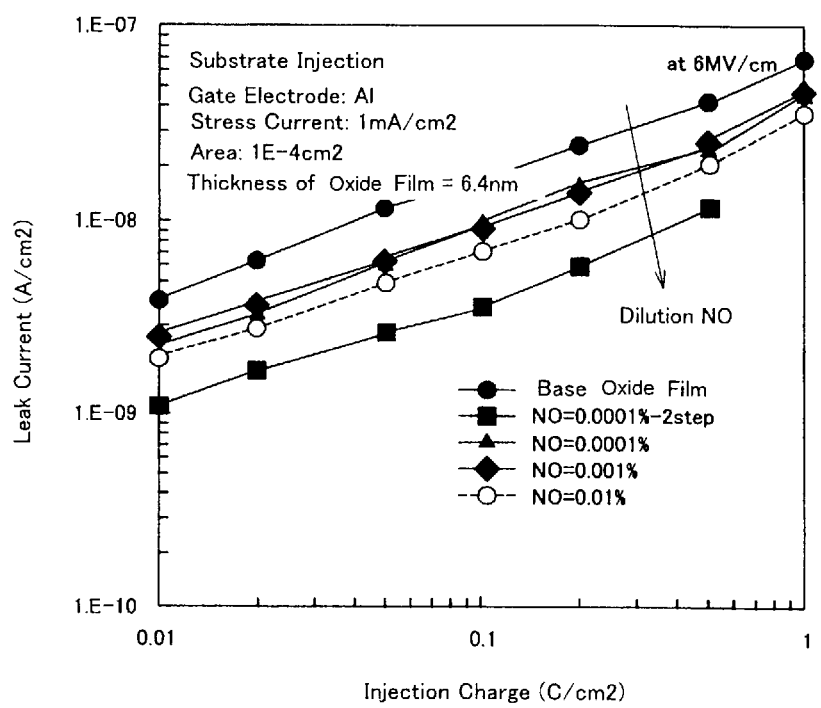

[FIG. 9]
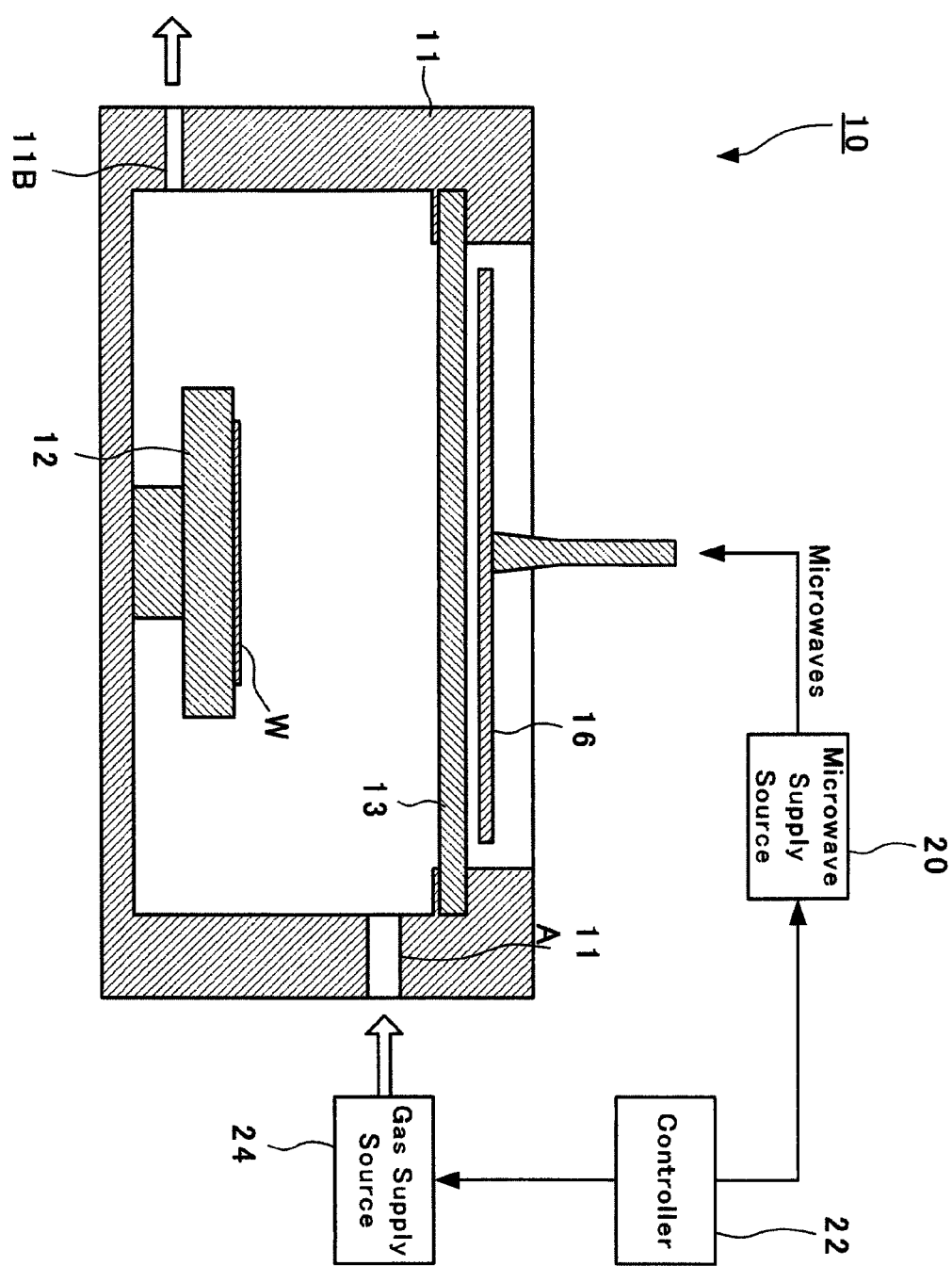

SEMICONDUCTOR STORAGE DEVICE INCLUDING A GATE INSULATING FILM WITH A FAVORABLE NITROGEN CONCENTRATION PROFILE AND METHOD FOR MANUFACTURING THE SAME

TECHNICAL FIELD

The present invent on relates to a semiconductor storage element (flash memory, EEPROM or the like) which operates by transferring a charge through an insulating film, and relates particularly to an improved method of forming a gate insulating film for placement between a semiconductor substrate and a gate electrode.

BACKGROUND ART

In relation to the electrical characteristics (write/erase characteristics) of a semiconductor storage device, the nitrogen concentration profile of the gate insulating film is of great significance. Conventionally, a thermal oxynitridation process is carried out to oxide films. However, this causes deterioration in transistor characteristics, and causes a nitrogen peak to form only at the interface between the oxide film and the substrate, thus it is difficult to form an appropriate nitrogen concentration profile. In other words, when thermal oxynitridation is performed nitrogen peaks are formed at specific locations with a specific concentration, and the formation of these nitrogen peaks is difficult to control.

In Japanese Unexamined Patent Publication No. 2003-60198, a semiconductor device comprising a gate insulating film with a improved nitrogen concentration profile is disclosed.

[Patent Document 1] Japanese Unexamined Patent Publication No. 2003-60198

DISCLOSURE OF INVENTION

Problems to be Solved by the Invention

However, the purpose of the invention disclosed in Japanese Unexamined Patent Publication No. 2003-60198 is to control gate leakage in a semiconductor device, not to improve the write/erase characteristics of flash memory and the like.

Accordingly, an object of the present invention is to provide a method for fabricating a semiconductor storage de vice with excellent electrical characteristics (write/erase characteristics) by means of a favorable nitrogen concentration profile of a gate insulating film.

Another object is to provide a semiconductor storage device with excellent electrical characteristics (write/erase characteristics) by means of a favorable nitrogen concentration profile of a gate insulating film.

Means for Solving the Problems

In order to achieve the above object, a semiconductor device fabricating method according to a first aspect of the present invention is a method for fabricating a semiconductor storage device that operates by transferring a charge through a gate insulating film formed between a semiconductor substrate and a gate electrode, which includes a step of introducing an oxynitriding species previously diluted by plasma excitation gas, into a plasma processing apparatus to form an oxynitride film on the semiconductor substrate as the gate insulating film, where the oxynitriding species contains NO gas at a ratio of 0.00001 to 0.01% to the total volume of gas introduced into the plasma processing apparatus.

A semiconductor device fabricating method according to a second aspect of the present invention is a method for fabricating a semiconductor storage device that operates by transferring a charge through a gate insulating film formed between a semiconductor substrate and a gate electrode, which includes a step of introducing an oxynitriding species previously diluted by plasma excitation gas, into a plasma processing apparatus to form an oxynitride film on the semiconductor substrate as the gate insulating film, wherein a ratio of oxygen gas to NO gas (O:NO) in the oxynitriding species is within a range from 1:0.000003 to 1:0.003.

A semiconductor device fabricating method according to a third aspect of the present invention is a method for fabricating a semiconductor storage device that operates by transferring a charge through a gate insulating film formed between a semiconductor substrate and a gate electrode, which includes a step of introducing an oxynitriding species previously diluted by plasma excitation gas, into a plasma processing apparatus to form an oxynitride film on the semiconductor substrate as the gate insulating film, wherein an absolute flow rate of the NO gas in the oxynitriding species is within a range from 0.0001 to 0.01 (sccm).

In the methods of manufacturing a semiconductor storage devices according to the first through third aspects of the present invention preferably nitrogen peaks of 0.02 to 0.5 atomic % are formed at a first interface of the gate insulating film with the semiconductor substrate, and a second interface with the gate electrode.

A semiconductor storage device according to a fourth aspect of the present invention comprises: a semiconductor substrate; a gate electrode formed on the semiconductor substrate and a gate insulating film formed between the semiconductor substrate and the gate electrode wherein the gate insulating film has nitrogen peaks of 0.02 to 0.5 atomic % at a first interface with the semiconductor substrate and a second interface with the gate electrode.

A fifth aspect of the present invention is a system for manufacturing a semiconductor storage device that operates by transferring a charge through a gate insulating film formed between a semiconductor substrate and a gate electrode, comprising a plasma processing apparatus which performs plasma processing on a semiconductor wafer on which the semiconductor storage device is formed; a gas supply device which introduces the gas used in the plasma processing into the plasma processing apparatus; and a controller which controls at least a gas mixing ratio in the gas supply device. Under the control of the controller, the gas supply device introduces an oxynitriding species previously diluted by plasma excitation gas, into the plasma processing apparatus, thereby forming an oxynitride film on the semiconductor substrate as the gate insulating film. Furthermore, under the control of the controller, the gas supply device operates in such a manner that the oxynitriding species contains NO gas at a ratio of 0.00001 to 0.01% to the total volume of gas introduced into the plasma processing apparatus.

A sixth aspect of the present invention is a recording medium recorded with a method used to manufacture a semiconductor storage device that operates by transferring a charge through a gate insulating film formed between a semiconductor substrate and a gate electrode, on which is recorded: a setting for introducing an oxynitriding species previously diluted by plasma excitation gas, into the plasma processing apparatus to forms an oxynitride film; on the semiconductor substrate as the gate insulating film; and a condition setting for ensuring that the oxynitriding species contains NO gas at a ratio of 0.00001 to 0.01% to the total volume of gas introduced into the plasma processing apparatus.

A seventh aspect of the present invention is a manufacturing system for a semiconductor storage device that operates by transferring a charge through a gate insulating film formed between a semiconductor substrate and a gate electrode, comprising: a plasma processing apparatus which performs plasma processing on a semiconductor wafer on which the semiconductor storage device is formed; a gas supply device which introduces the gas used in the plasma processing into the plasma processing apparatus; and a controller which controls at least a gas mixing ratio in the gas supply device. Under the control of the controller, the gas supply device introduces an oxynitriding species previously diluted by plasma excitation gas into the plasma processing apparatus, thereby forming an oxynitride film on the semiconductor substrate as the gate insulating film. Furthermore, under the control of the controller, the gas supply device operates in such a manner that the ratio of oxygen gas to NO gas (O:NO) in the oxynitriding species is within a range from 1:0.000003 to 1:0.003.

An eighth aspect of the present invention is a recording medium which records a method used to manufacture a semiconductor storage device that operates by transferring a charge through a gate insulating film formed between a semiconductor substrate and a gate electrode, comprising: a setting for forming an oxynitride film on the semiconductor substrate as the gate insulating film by introducing an oxynitriding species previously diluted by plasma excitation gas, into a plasma processing apparatus; and a condition setting for ensuring that a ratio of oxygen gas to NO gas (O:NO) in the oxynitriding species is within a range from 1:0.000003 to 1:0.003.

A ninth aspect of the present invention is a manufacturing system for a semiconductor storage device that operates by transferring a charge through a gate insulating film formed between a semiconductor substrate and a gate electrode, comprising: a plasma processing apparatus which performs plasma processing on a semiconductor wafer on which the semiconductor storage device is formed; a gas supply device which introduces the gas used in the plasma processing into the plasma processing apparatus; and a controller which controls at least the gas mixing ratio in the gas supply device. Under the control of the controller, the gas supply device introduces an oxynitriding species previously diluted by plasma excitation gas into the plasma processing apparatus, thereby forming an oxynitride film on the semiconductor substrate as the gate insulating film. Furthermore, under the control of the controller, the gas supply device operates in such a manner that an absolute flow rate of the NO gas in the oxynitriding species is within a range from 0.0001 to 0.01 (sccm).

A tenth aspect of the present invention is a recording medium which records a method used to manufacture a semiconductor storage device that operates by transferring a charge through a gate insulating film formed between a semiconductor substrate and a gate electrode, containing: a setting for forming an oxynitride film on the semiconductor substrate as the gate insulating film by introducing an oxynitriding species previously diluted by plasma excitation gas, into a plasma processing apparatus; and a condition setting for ensuring that an absolute flow rate of the NO gas in the oxynitriding species is within a range from 0.0001 to 0.01 (sccm).

Defective bond of Si—O is typically present at the interface with the oxide film, and this can cause degradation of the electrical characteristics. Nitrogen is thought to repair this bond. However, when the nitrogen concentration peak is 0.02 atomic % or less, the reparative effect is insufficient. On the other hand, when the nitrogen concentration peak is 0.5 atomic % or greater, excessive nitrogen is introduced, which is also thought to produce defective bond of Si—O.

In a semiconductor storage device, such as flash memory or EEPROM, which operates by transferring a charge through an insulating film, electrical stress generated by the charge transfer is applied to the insulating film from both the substrate side and surface side (gate electrode side). For this reason, the insulating film, which has nitrogen peaks at both interfaces, suppresses SILC (Stress-Induced Leakage Current) generation (see FIG. 8 and FIG. 9), thereby improving the characteristics of the semiconductor storage element. According to the present invention, nitrogen peaks can be formed simultaneously on the surface and interface sides of the gate insulating film of the semiconductor storage device (flash memory) (see FIG. 4). If the concentration of the nitrogen peaks formed at each interface of the gate insulating film is 0.5 atomic % or less excellent electrical characteristics can be obtained.

BEST MODE FOR CARRYING OUT THE INVENTION

The present invention is applicable to a semiconductor storage device (flash memory, EEPROM or the like) which operates by transferring a charge through an insulating film.

FIG. 1 is an explanatory diagram showing examples of write and erase operations in flash memory, representing an application of the present invention. During a write operation, a charge flows from a silicon substrate to a gate electrode (FG: Floating Gate) through a tunnel insulating film. On the other hand, during an erase operation, a charge flows from the gate electrode (FG) to the silicon substrate through the tunnel insulating film. The present invention is characterized by the structure (nitrogen concentration profile) of the tunnel insulating film (gate insulating film).

To avoid damaging the gate insulating film, plasma processing of the film is performed using an RLSA (Radial Line Slot Antenna) microwave plasma processing apparatus, which produces a high density plasma with a low electron temperature. As a method of forming a gate insulating film which has nitrogen peaks within a range from 0.02 to 0.5 atomic % at the interfaces (on the Si substrate side and gate electrode side), a microwave-based RLSA (Radial Line Slot Antenna) plasma processing apparatus is used, and the nitride (oxynitride) species is diluted by plasma excitation gas at the position where this is introduced into the plasma processing apparatus.

An 8 inch substrate (wafer) is subjected to processing under the following conditions:

Microwave power 3,500 W; preferred range 2000 to 4000 W

Processing pressure: 1 Torr; preferred range 50 mTorr to 10 Torr

Processing temperature: 400° C.; preferred range room temperature to 500° C.

Oxynitriding species: NO; preferably a gas containing no hydrogen (such as N2O, NO2, N2)

Gas flow rate: Kr:O2=1000:30 sccm preferred range 500 to 5000:10 to 500 sccm

Here, it is important that the volume of NO gas conforms to one of the following:

(1) NO gas mixing ratio relative to total volume of gas introduced into plasma processing apparatus:
0.00001 to 0.01%
More preferably the NO gas mixing ratio is 0.001% or less.
(2) NO gas mixing ratio relative to oxygen gas:
1:0.000003 to 1:0.003
(3) Absolute flow rate of NO gas: 0.0001 to 0.1 sccm During actual plasma oxynitridation processing, the oxynitriding species (gas for oxynitriding species) is diluted by a plasma excitation gas or noble gas before being introduced into the apparatus. The semiconductor substrate is subjected to direct plasma oxynitridation processing to form an oxynitride insulating film on the semiconductor substrate surface. Alternatively, to enhance the controllability of the low nitrogen peak in the insulating film, the semiconductor substrate can be pre-oxidized, and the insulating film can be subsequently formed by plasma oxynitridation processing (two-step processing). To deposit a thin film, the substrate can be processed with an oxynitriding species formed by remote plasma and diluted only by noble gases.

FIG. 2 is a graph showing the relationship in the gate insulating film, between the NO gas mixing ratio and the nitrogen concentration of the interface with the oxynitride film. It is apparent from the graph that when two step processing is performed and when the NO gas mixing ratio (dilution ratio) is 0.0001% or less, a favorable nitrogen concentration (0.5 atomic % or less) is obtained at the interface.

FIG. 3 is a graph showing the variation in nitrogen concentration for different ratios of NO gas total volume of gas introduced into the plasma processing apparatus. It is apparent from the graph that when two step processing is performed and when the NO gas mixing ratio (dilution ratio) is 0.001% or less, a favorable nitrogen concentration (0.5 atomic % or less) is obtained at the interface.

[Correcting for Atomic Peaks of 0.5 Atomic % or Less on the Surface Side]

The oxynitride film formed by the process described above is subjected to nitriding under the following conditions, again using an RLSA (Radial Line Slot Antenna) microwave plasma processing apparatus:

An 8 inch substrate (wafer) is used.

Microwave power: 1,600 W; preferred range 1000 to 4000 W

Processing pressure: 950 mTorr; preferred range 50 mTorr to 10 Torr

Processing temperature: 400° C.; preferred range room temperature to 500° C.

Nitride species: N2, or a gas that contains no oxygen (such as NH3)

Gas flow rate: Xe:N2=1000:40 sccm; preferred range 3000 to 500:10 to 200 sccm

FIG. 4 is a diagram that describes the action of the present invention, by showing stepwise how the nitrogen concentration peak is formed. In the figure, in case (1) where only plasma oxynitridation is performed on the gate insulating film, a large peak is formed on the semiconductor substrate side, and a small peak is formed on the gate electrode side. Similarly, in case (2) where the gate insulting film is subjected to plasma processing to form a base oxidation film, and then subjected to plasma oxynitridation, a large peak is formed on the semiconductor substrate side, and a small peak is formed on the gate electrode side. On the other hand, in case (3) where plasma nitridation processing is performed in addition to the steps in case (2), the nitrogen peak on the gate electrode side can be controlled.

FIG. 5 (A), (B) are schematic illustrations showing substrate injection stress (write operation) and gate injection stress (erase operation). FIG. 6 is a graph showing the relationship (trap characteristics between the injection charge and the gate voltage fluctuation during a write operation (substrate injection stress). FIG. 7 is a graph showing the relationship (SILC characteristics) between the injection charge and the leakage current during a write operation (substrate injection stress). FIG. 8 is a graph showing the relationship (SILC characteristics) between the injection charge and the leakage current during an erase operation (gate injection stress).

[Evaluation of Electrical Characteristics Using a Capacitor MOS-CAP)] (see FIG. 6 Through FIG. 8)

(1) Trap characteristics: From FIG. 6, it is apparent that an oxynitriding species (NH3) that contains hydrogen increases the number of electron traps and is therefore unsuitable. Electron taps cause a deterioration of the write/erase characteristics of flash memory. On the other hand, it is apparent that introducing NO as reduces the number of electron traps, and diluting the NO gas yields further improvement.

(2) SILC characteristics: SILC (Stress Introduced Leakage Current) is an electrical characteristic that reflects the data retention characteristics of the flash memory. When the leakage current is large, a greater amount of stored charge is leaked, causing deterioration in memory characteristics. Introducing NO gas reduces leakage current, but as shown in FIG. 7 and FIG. 8, diluting the NO gas yields further improvements to leakage current in both stress directions. Moreover, performing oxynitridation processing with a gas containing hydrogen produces nitric acid (HNO3) which can corrode the device.

In a semiconductor storage device, such as flash memory or EEPROM, which operates by transferring a charge through an insulating film, electrical stress generated by the charge transfer is applied to the insulating film from both the substrate side and surface side. For this reason, the insulating film, which has nitrogen peaks at both interfaces, suppresses SILC (Stress-Induced Leakage Current) generation (see FIG. 7 and FIG. 8), thereby improving the characteristics of the semiconductor storage element.

According to the present invention, nitrogen peaks can be formed simultaneously on the surface and interface sides of the gate insulating film of the semiconductor storage device (flash memory) (see FIG. 4). In this case, the use of an oxynitriding species (a gas for oxynitriding species) previously diluted by plasma excitation as is preferred. If the concentration of the nitrogen peaks formed at each interface of the gate insulating film is 0.5 atomic % or less, excellent electrical characteristics can be obtained. Furthermore, it was confirmed that by performing plasma processing in the absence of hydrogen, electron capture characteristics are improved, and the write/erase characteristics of flash memory are also improved.

FIG. 9 shows a configuration example of a plasma processing system for implementing the present invention. A plasma processing system 10 has a processing vessel 11 which comprises a substrate holder 12 that holds a silicon wafer W serving as the substrate to be processed. Gas inside the processing vessel 11 is discharged from an exhaust port 11B through an exhaust pump not shown in the figure.

An opening is formed in the device above the processing vessel 11 at a position corresponding to the silicon wafer W placed on the substrate holder 12. This opening is covered by a dielectric plate 13 made of quartz and substances such as Al2O3, AlN, and Si3N4. A planar antenna, here a RLSA (radial line slot antenna 16, is positioned on top of the dielectric plate 13 (on the outside of the processing vessel 11). In this antenna 16, a plurality of slots are formed through which electromagnetic waves are supplied from a waveguide can pass. The waveguide is disposed above (on the outside of the antenna 16.

In the internal wall of the processing vessel 11, a gas supply port 11A is provided for introducing gas during plasma processing. From this gas supply port 11A, gas premixed in a gas supply source 24 is introduced into the processing vessel 11.

Though not shown in the figure, the flow rate of the gas can be controlled by using a flow regulating valve or the like at the mixing stage.

The plasma processing system 10 used in the present invention comprises a microwave supply source 20 (electromagnetic wave generator) which, to excite the plasma, generates electromagnetic waves at several gigahertz, for example 2.45 GHz. The microwaves generated by the microwave supply source 20 propagate through the waveguide and are introduced uniformly into the processing vessel 11 through the antenna 16.

The microwave supply source 20 and the gas supply source 24 are controlled by a controller 27. Specifically in the gas supply source 24, the mixing ratio and absolute flow rate of the NO gas contained in the oxynitriding species (gas of oxynitriding species) is adjusted according to the settings described earlier. For example, the gas supply source 24 operates such that the ratio (O:NO) of oxygen gas to NO gas is within a range from 1:0.0000003 to 1:0.003. Alternatively, the gas supply source 24 operates such that the absolute flow rate of the NO gas contained in the oxynitriding species (gas of oxynitriding species) is within a range from 0.0001 to 0.01 (sccm). In another alternative, the gas supply source 24 operates such that the oxynitriding species contains 0.00001 to 0.01% NO gas relative to the total volume of gas introduced into the plasma processing vessel 11.

Control of the NO gas mixing ratio or absolute flow rate in the gas supply source 24 ca be implemented by a program (settings) stored in the controller 22. Moreover, control programs related to gas flow rates and mixing ratios can be stored on a storage device external to the controller 22. For example the relevant program (settings) can be stored in advance on a recording medium such as CD-ROM, DVD, MO, floppy disk, HD, or memory and either installed from that medium or loaded directly from the medium. There are no restrictions on the method used to record the program, and any optical, magnetic, opto-magnetic or other method can be used.

While preferred embodiments of the invention have been describe above, the invention is not to be considered as being limited by the foregoing description, and is only limited by the scope of the appended claims.

BRIEF DESCRIPTION OF THE DRAWINGS

FIG. 1 is an explanatory diagram showing write and erase operations in a semiconductor storage device (flash memory), representing an application of the present invention.

FIG. 2 is a graph showing the relationship in the gate insulating film, between the NO gas mixing ratio and the nitrogen concentration of the interface with the oxynitride film.

FIG. 3 is a graph showing the variation in nitrogen concentration for different ratios of NO gas to the total volume of gas.

FIG. 4 is a diagram that describes the action of the present invention, by showing stepwise how the nitrogen concentration peak is formed.

FIG. 5 (A), (B) are schematic illustrations of substrate injection stress (write operation) and gate injection stress (erase operation).

FIG. 6 is a graph showing the relationship (trap characteristics) between the injection charge and the gate voltage fluctuation during a write operation (substrate injection stress).

FIG. 7 is a graph showing the relationship (SILC characteristics between the injection charge and the leakage current during a write operation (substrate injection stress).

FIG. 8 is a graph showing the relationship (SILC characteristics) between the injection charge and the leakage current during an erase operation (gate injection stress).

FIG. 9 is an explanatory diagram (combined cross-sectional and block diagram) showing a configuration of a plasma processing system for implementing the present invention.

The invention claimed is:

1. A method for fabricating a semiconductor storage device that operates by transferring a charge through a gate insulating film formed between a semiconductor substrate and a gate electrode, comprising:
   forming an oxide film on said semiconductor substrate;
   introducing an oxynitriding species previously diluted by plasma excitation gas, into a plasma processing apparatus;
   generating the oxynitriding species by a plasma;
   forming an oxynitride film on said semiconductor substrate as said gate insulating film by performing plasma oxynitridation with the oxynitriding species on the oxide film, the plasma oxynitridation forming nitrogen peaks at an interface between the semiconductor substrate and the gate insulating film and forming nitrogen peaks at an interface between the gate insulating film and the gate electrode, such that the nitrogen peaks at the interface between the semiconductor substrate and the gate insulating film are between 0.02 to 0.5 atomic %;
   introducing a nitriding species into the plasma processing apparatus; and
   enlarging the nitrogen peaks at the interface between the gate insulating film and the gate electrode by performing plasma nitridation processing with the nitriding species on said gate insulating film, after forming said oxynitride film, such that the nitrogen peaks at the interface between the gate insulating film and the gate electrode are between 0.02 to 0.5 atomic %,
   wherein said oxynitriding species contains NO gas at a ratio of 0.00001 to 0.01% to the total volume of gas introduced into said plasma processing apparatus.

2. A fabricating method according to claim 1, wherein the performing plasma nitridation processing on said gate insulating film is performed by forming a plasma with a nitride species gas that does not contain oxygen.

3. A method for fabricating a semiconductor storage device according to claim 1,
   wherein said oxynitriding species comprises an oxygen gas and NO gas, and
   a ratio of said oxygen gas to said NO gas (O:NO) is within a range from 1:0.000003 to 1:0.003.

4. A method for fabricating a semiconductor storage device according to claim 1,
   wherein an absolute flow rate of the NO gas in said oxynitriding species is within a range from 0.0001 to 0.01 (sccm).

5. A method for fabricating a semiconductor storage device according to claim 1,
   wherein the nitriding species is $N_2$.

6. A method for fabricating a semiconductor storage device according to claim 1,
   wherein the nitriding species does not contain oxygen.

* * * * *